United States Patent [19]

Erjavic et al.

[11] Patent Number: 5,355,320
[45] Date of Patent: Oct. 11, 1994

[54] SYSTEM FOR CONTROLLING AN INTEGRATED PRODUCT PROCESS FOR SEMICONDUCTOR WAFERS AND PACKAGES

[75] Inventors: Scott A. Erjavic, Danville; Ronald E. Frye, Jr., Newman, both of Calif.

[73] Assignee: VLSI Technology, Inc., San Jose, Calif.

[21] Appl. No.: 847,517

[22] Filed: Mar. 6, 1992

[51] Int. Cl.[5] ...................... G01R 31/28; G06F 11/00
[52] U.S. Cl. ..................... 364/488; 364/468; 364/571.04; 364/580
[58] Field of Search ............... 364/488, 489, 490, 491, 364/468, 571.04, 580, 474.24; 364/468, 571.04, 580, 474.24

[56] References Cited

U.S. PATENT DOCUMENTS

| | | | |
|---|---|---|---|
| 4,622,647 | 11/1986 | Sagnard et al. | 364/586 |
| 4,869,813 | 9/1989 | Bailey et al. | 209/538 |
| 4,878,179 | 10/1989 | Larsen et al. | 364/490 |
| 4,901,218 | 2/1990 | Cornwell | 364/131 |
| 5,086,397 | 2/1992 | Shuster et al. | 364/468 |
| 5,097,421 | 3/1992 | Maney et al. | 364/478 |
| 5,111,404 | 5/1992 | Kotani | 364/468 |
| 5,150,288 | 9/1992 | Imai et al. | 364/132 |

OTHER PUBLICATIONS

Thruput Systems Inc., Mesa, Arizona, 1991.
New Release, KLA Instruments Corporation, San Jose, California, May 21, 1991.
LTX, Westwood, Massachusetts, 1991.
LTX Corporation, Data Vision Product Description, 1990.

*Primary Examiner*—Thomas G. Black
*Assistant Examiner*—Susan Wieland
*Attorney, Agent, or Firm*—Majestic, Parsons, Siebert & Hsue

[57] ABSTRACT

A distributed control system for controlling an integrated production process for semiconductor wafers and packages. A workstation is connected to a tester and a sorter/handler for configuring and controlling both devices. An operator need not be aware of different syntaxes and configurations required by different brands of testers, sorters/probers or handlers. The workstation is connected to a computer-aided manufacturing node to obtain setup and other processing control information and to send updated control information to the node through a network. If the data collected from the testers indicates low yield, the computer-aided manufacturing node is alerted.

20 Claims, 4 Drawing Sheets

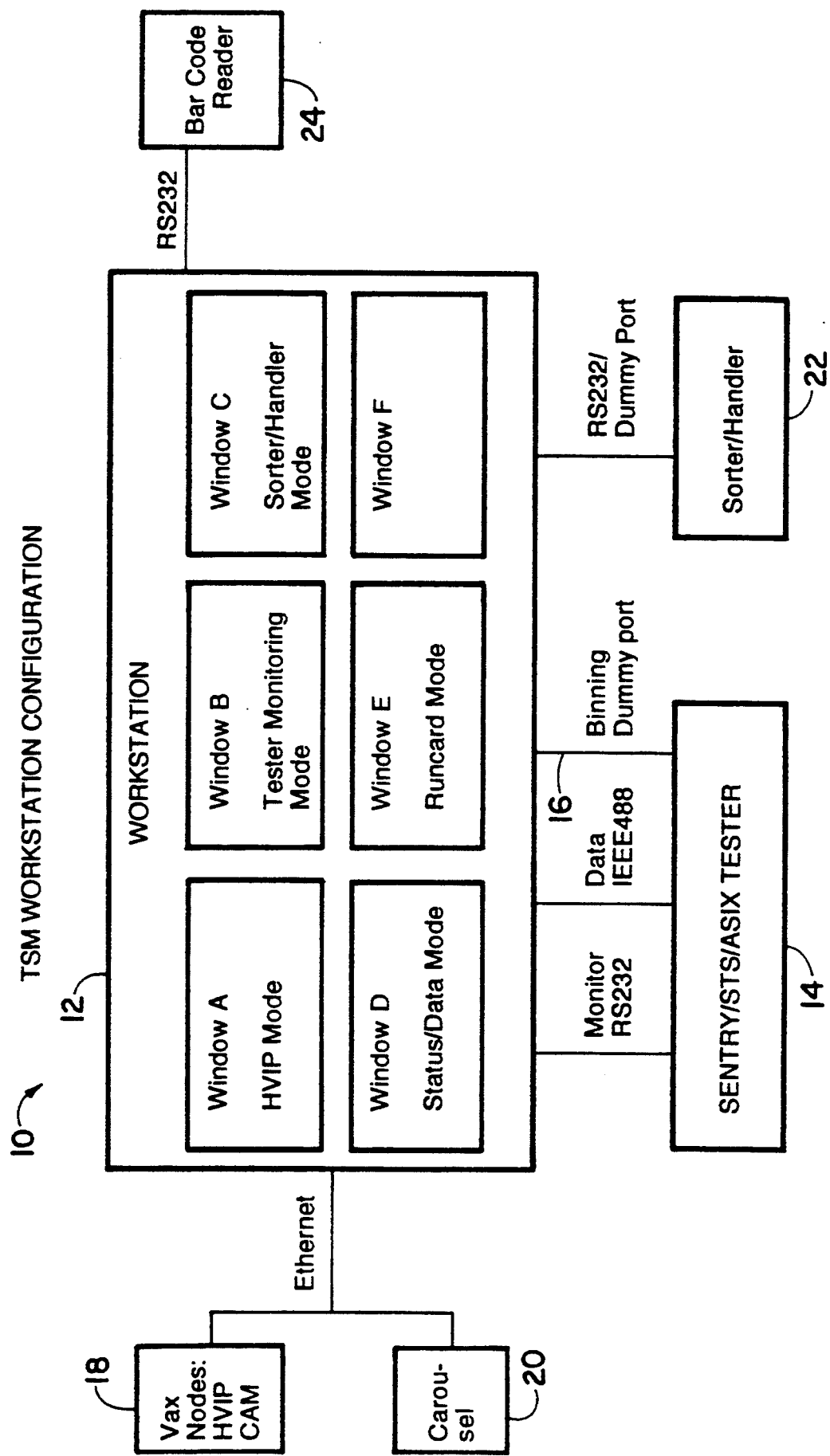
FIG._1.

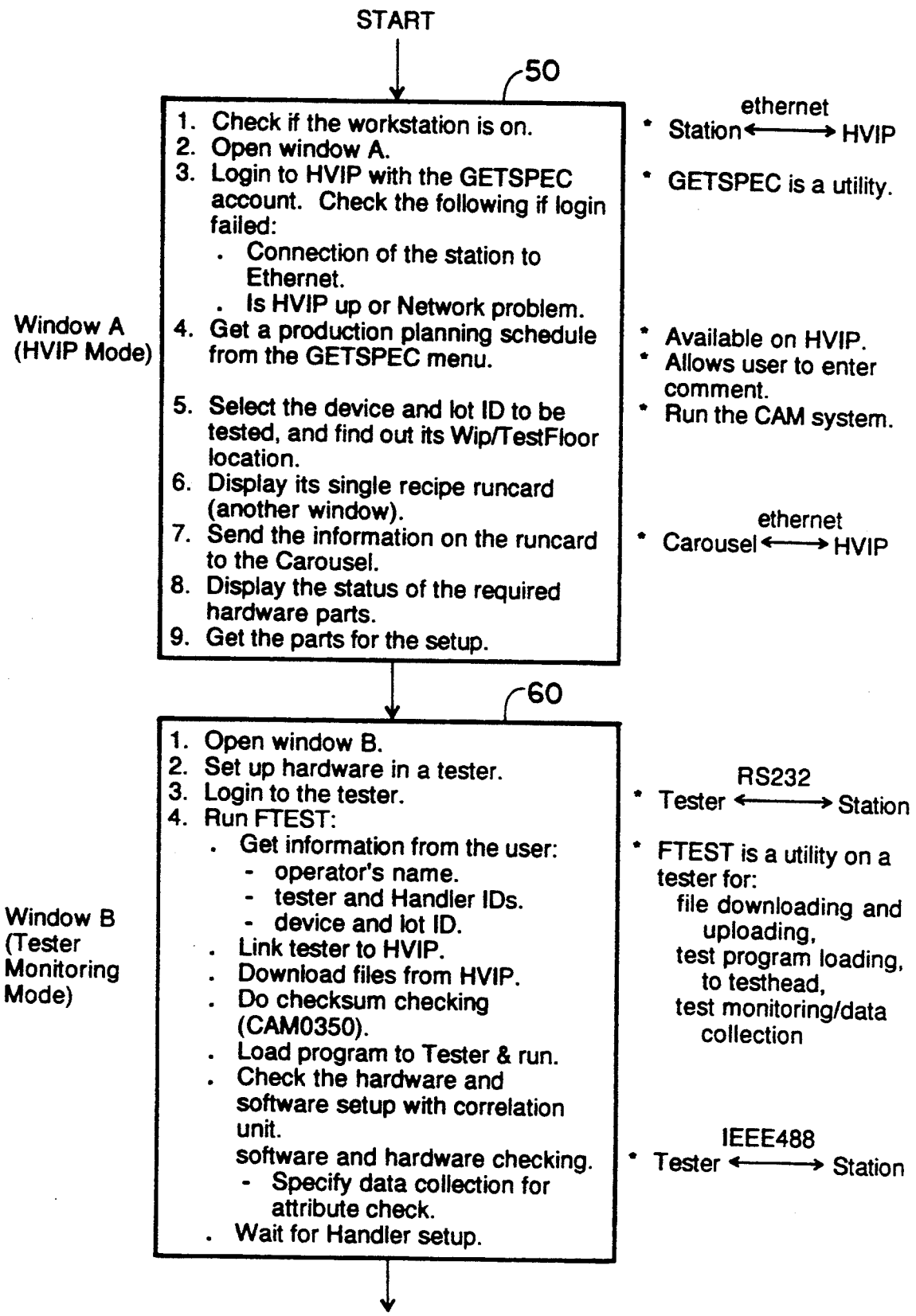
FIG._2A.

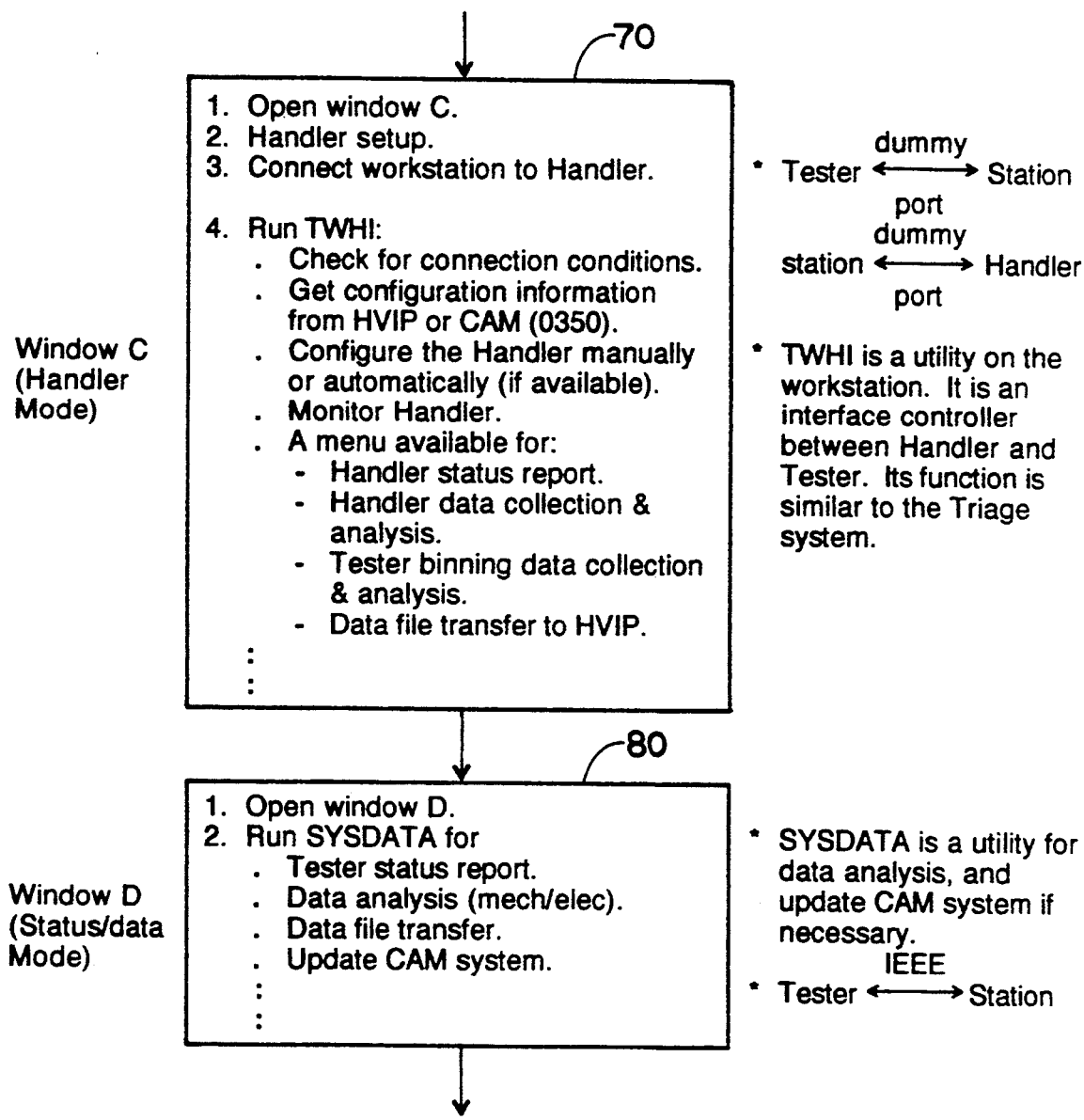
FIG._2B.

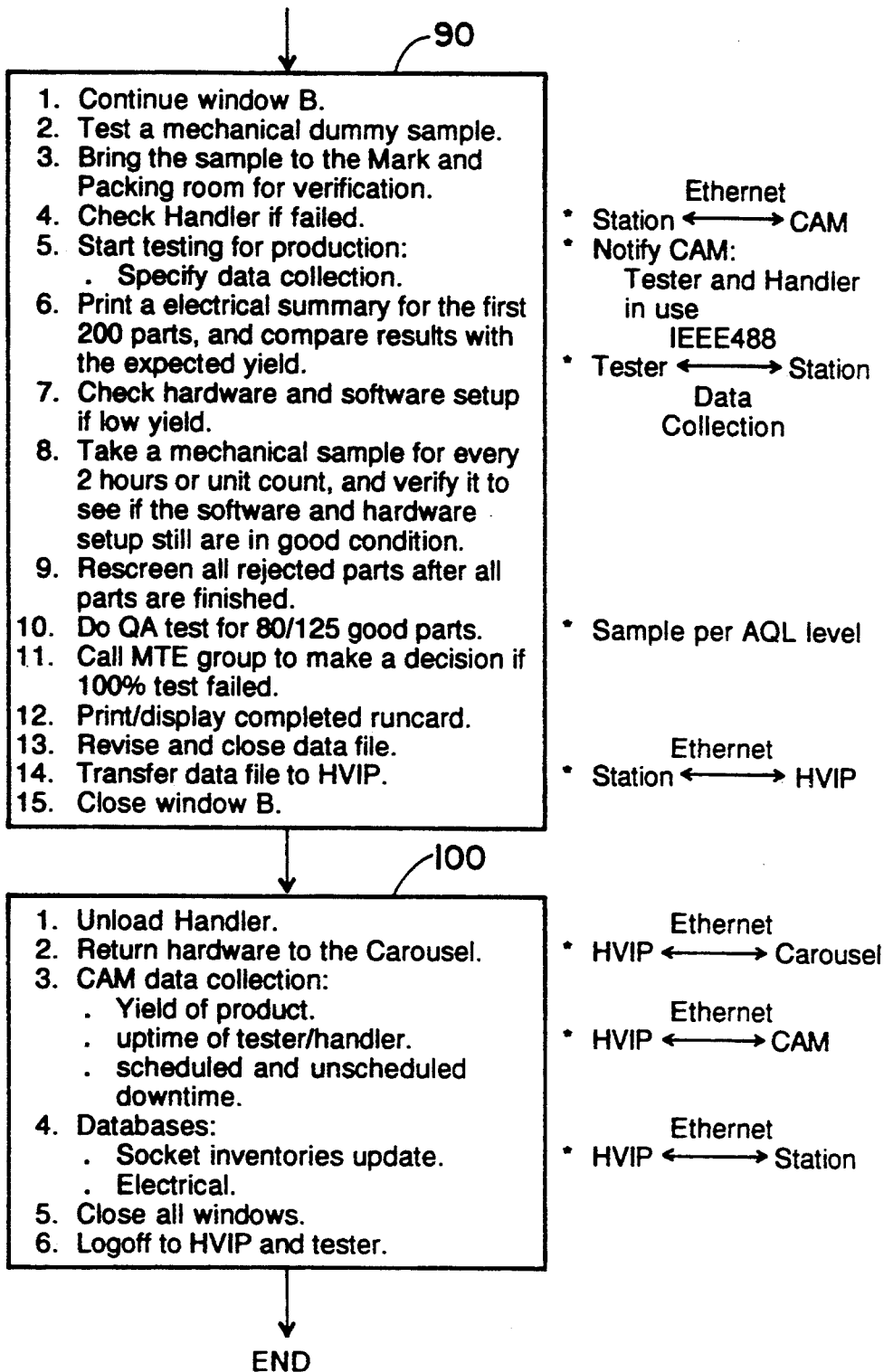
FIG._2C.

SYSTEM FOR CONTROLLING AN INTEGRATED PRODUCT PROCESS FOR SEMICONDUCTOR WAFERS AND PACKAGES

BACKGROUND OF THE INVENTION

This invention relates in general to the processing of semiconductor chips and packages and in particular, to a system for controlling an integrated production process for the processing of semiconductor wafers and packages.

After a semiconductor wafer has been fabricated, it undergoes a series of processing steps before the finished product in the form of semiconductor chip packages are shipped to customers. First, the semiconductor wafer is handled by a prober or sorter in conjunction with a tester for testing the electrical properties of the dies on the wafer, in order to sort the bad dice from the good ones. Typically, the good dice are put in bins separate from bins for the bad dice, in a process called binning. Thereafter, the wafers are cut into separate dice and each individual good die is then enclosed within a package. Semiconductor packages are then handled by a handler in conjunction with a tester to again test the electrical properties of the dies within the packages. The second round of testing is necessary since the packaging process may have damaged the dice contained in the packages or the leads of the package.

To improve overall yield, it is important to collect data at each stage of the above-described process to make sure that the equipment used for testing and processing is properly set up, calibrated and functioning normally, and to discover possible problems in the fabrication process of the wafers. For this purpose, various control systems have been proposed.

Thus, a control system sold by KLA Instruments Corporation of San Jose, Calif., for controlling probers or sorters sold by the same company, enables operators to analyze wafer test results. The capabilities of the KLA control system include compilation of individual and composite wafer result maps that show the frequency of dies passing or failing, and creation of control maps indicating which dies to ink, skip or test. Typically, the dice failing to pass the test are marked by ink dots. The control system supplied by KLA Instruments employs a network where a number of cell controllers are connected by an Ethernet network, where each cell controller is used to control a test cell, which in turn may include a number of probers. The network system enables operators more flexibity in creating and editing wafer setup files and control maps, and for monitoring the status of different probers.

Triage Corporation of Hillsboro, Oreg. supplies a control system employing a network where a number of cell controllers are connected by an Ethernet network, where each cell controller is used to control a test cell, which in turn may include a number of Electroglas probers. The network system enables operators more flexibility in creating and editing wafer setup files and control maps, and for monitoring the status of different probers.

LTX of Westwood, Mass., has made available a distributed network workstation system for controlling and monitoring the status of a number of testers and for collecting and analyzing data from the testers.

Thruput Systems Inc. of Mesa, Ariz., has commercialized a system for controlling test equipment; in a product brochure from Thruput Systems, it is stated that the Thruput system monitors test heads from different testers as well as handlers. The system provides fixed format product test time reports and handler assembly reports.

Among the systems described above, the control systems provided by LTX and KLA Instruments are each compatible only with the probers, testers or handlers provided by the same company and not compatible with equipment from any other company. The control systems provided by Thruput Systems and Triage appear to be compatible only with specific equipment. From the point of view of overall test production management, it would be desirable to be able to control and monitor the status of testers, sorters and handlers on the test floor and collect data therefrom for yield analysis during production. Since the above-described types of control systems may not be compatible with equipment provided by some manufacturers, it is difficult to adopt any one of the systems for monitoring the whole test floor. This is particularly the case where, as is true for many integrated circuit manufacturers, equipment from different manufacturers are used on the test floor. In other words, an operator on a typical test floor would have to physically attend to each computer controlling each individual piece of equipment in order to control and monitor the status of the equipment, and collect data therefrom for analysis. Even if one of the above-described systems is used, the operator would still have to attend to a system for monitoring probers and may still need to attend to a different system for monitoring testers. The lack of uniformity and overall control means that an operator would have to keep track of a large number of procedures and factors.

The above-described problems due to the lack of an overall production management tool are compounded in the applications specification integrated circuit (ASIC) environment. The ASIC manufacturer manufactures wafers and packages in accordance with different specifications from a number of customers. Each specification may call for a different setup or equipment for testing and processing. For example, different printed circuit boards would have to be used for testing wafers and packages with different specifications. According to the experience of one integrated circuit manufacturer, about ten thousand printed circuit boards would have to be kept in stock and maintained at any time for testing wafers and packages. These printed circuit boards are kept in a storage and retrieval unit called a carousel, a system monitored and controlled by means of a personal computer. The personal computer enables an operator to keep track of the boards, including their preventive maintenance schedules. Thus, when a wafer manufactured in accordance with the particular specification is to be tested, information on the printed circuit board required by the specification would have to be fetched so as to determine the appropriate printed circuit board to be used for testing. Such board would then be retrieved from the storage and retrieval unit or carousel with the aid of the personal computer. The printed circuit board is then used in conjunction with a wafer sorter (or prober) and a tester for testing the electrical properties of the wafer. The printed circuit board is then returned to the carousel. The number of times the same board has been used may need to be monitored in order to perform preventive maintenance.

After the wafer has been cut into different dies and packaged, the packages are then handled by the handlers and tested using the testers again in conjunction with a specified printed circuit board. For the above-mentioned integrated circuit manufacturer, a host VAX computer is used as the primary control and computational platform for the sort, test and mark/pack areas. This computer stores and loads all production test programs and buffers all set up information from computer-aided manufacturing node for automatic station configuration and real-time yield monitoring. It carries out yield computations and maintains all electrical and mechanical statistical process control data for all testers, sorters, handlers and lead inspection systems. It also controls through the personal computer the use of the printed circuit boards from the storage carousel.

Tester, sorter/handler manufacturers usually sell control stations together with the testers, sorters/handlers. Such control stations, however, are not compatible with other computers such as VAX computers. Thus, the host VAX computer cannot communicate directly with the control stations for the testers, probers and handlers sold together with such equipment by the manufacturers. Therefore, an additional computer must be used at each tester, prober or handler location to be the interface between the control device for a particular tester, sorter or handler, and the host VAX computer. In order to operate a tester, sorter or handler, an operator must first retrieve a production program from the host VAX computer, using the additional computer at the location at the piece of equipment, perform any interface procedures required with a control device in order to implement the production program for such equipment, Typically, the control terminal for a particular tester, sorter or handler has its own syntax and configuration, so that an operator would have to know such syntax and configuration in order to implement the production program on such equipment.

Since a sorter (prober) or handler must communicate with a tester in order for the two pieces of equipment to coordinate the handling and the testing of wafers and packages, an electronic interface register (EIR) cable is used to connect the sorter (prober) or handler to the tester. However, as indicated above, no control system is available which can be used to control a sorter as well as a tester, an operator would have to control and monitor individually the tester and the sorter connected to it by the EIR cable using the control monitors for the tester and the sorter. Even though the signals transmitted through the EIR cable contain important information on the performance of the tester and sorter or handler and the tested device, presently available control systems do not take advantage of such information.

None of the above-described systems is entirely satisfactory. It is therefore desirable to provide an improved system for controlling an integrated production process for semiconductor chips and packages in which the above-described difficulties are eliminated or reduced.

SUMMARY OF THE INVENTION

This invention envisions a control device dedicated to and connected to at least a tester and a sorter or a handler for configuring and controlling the tester and the sorter or handler. The control device enables an operator to configure the tester and the sorter or handler, cause the sorter to sort the wafer to be tested or a handler to handle a package to be tested, and cause the tester to test the wafer or package according to a predetermined routine. The operator may also use the control device to collect data related to the sorting or handling and the testing.

Another aspect of the invention is based on the observation that the data collected by means of the control device would be important for wafer fabrication. According to this aspect, the invention includes a system for controlling an integrated production process for the processing of semiconductor wafers and packages where the process employs wafer sorters, package handlers, testers, and a computer-aided manufacturing node for providing and storing setup and wafer and package processing control information. The system comprises a control device dedicated to and connected to at least a tester for configuring the tester and a network connecting the device to the node, so that the device enables an operator to test selected chips or packages according to the predetermined routine and to update and send updated processing and control information to the node. In this manner, if data collected by the control device indicates yield problems, the computer-aided manufacturing node will be notified so that investigation can be conducted on the fabrication process of the wafer and any problems discovered corrected.

Another aspect of the invention is directed to the above-described system where the system includes a plurality of control devices having the same graphical user interface. Even if two of the testers have different syntaxes and configurations, these will be transparent to an operator since the operator will be using the same graphical user interface on each of the control devices for controlling the two testers. The system has multitasking capability so that at any one of the control devices, an operator may obtain status information on any tester, sorter or handler, collect and analyze data from the testers, sorters and handlers, perform configuration and control of any one of the testers, sorters and handlers, and update process control information and send such information to the computer-aided manufacturing node.

BRIEF DESCRIPTION OF THE DRAWINGS

FIG. 1 is a block diagram of a control system useful for illustrating the invention.

FIGS. 2A–2C together form a flow chart illustrating the operation of the system of FIG. 1.

DETAILED DESCRIPTION OF THE PREFERRED EMBODIMENT

FIG. 1 is a block diagram of a system for controlling an integrated production process for the processing of semiconductor wafers and packages to illustrate the invention. As shown in FIG. 1, system 10 includes at least one control device 12 which may be a workstation directly connected to a tester 14 by direct connections such as monitor cable RS232 and data cable IEEE488. Workstation 12 is also connected to the tester by EIR cable 16. Workstation 12 is connected by means of the Ethernet to 2 VAX nodes: (1) a host computer for integrated production (HVIP), and (2) computer-aided manufacturing (CAM). The HVIP node enables an operator to assemble the information on the hardware required and send such information to the storage and retrieval unit or carousel 20. In the preferred embodiment, workstation 12 is also connected to a sorter/handler 22 by means of a RS232 cable and to a bar code reader 24 by another RS232 cable. The bar code reader is useful for user badge or equipment identification; it will be understood, however, that instead of a bar code reader, the RS232 cable may be connected to another user input device such as a keyboard. If more than one tester and sorter/handler are employed, a second workstation would be used which is connected to the second tester and sorter/handler in a manner same as that shown in FIG. 1, where the second workstation is connected to the first workstation, VAX node 18 and, carousel 20 by the Ethernet network.

It will be evident from FIG. 1 that, instead of using an EIR cable to connect the tester and the sorter/handler which works in conjunction with the tester, the EIR cable 16 now connects the tester 14 and the workstation 12. Thus, the signals that were carried by the EIR cable between the tester and the sorter/handler in conventional systems continue to be carried by EIR cable 16 to enable the tester and the sorter/handler to cooperate, except that workstation 12 is now able to interrogate the signals present on the cable for data collection and analysis.

As illustrated in FIG. 1, workstation 12 includes a monitor and a graphical user interface which includes multiscreen or windowing capability. The workstation effectively replaces the additional computer and the tester control station at the tester location. Workstation 12 is therefore capable of effectively interfacing with different brands of testers from different manufacturers, including but not limited to Sentry, STS, and ASIX. These different tester brands each have their own syntax and configuration. By employing a workstation and appropriate software, an operator need not be knowledgeable of the different syntaxes and configurations of the different kinds of testers; instead, the operator needs to learn only to use the graphical user interface of the workstation 12.

If more than one workstation is employed in system 10, preferably each workstation will have the same graphical user interface, so that the operator would not need to learn a new procedure for a different workstation. In such manner, the different syntaxes and configurations of the various tester brands will be transparent to the operator. An experienced operator would use terminal emulation software available commercially to configure different pieces of test equipment; once so configured, during the testing procedure an operator need not be aware of such syntaxes and configurations.

The operation of system 10 is now illustrated by reference to the flow chart in FIGS. 2A-2C. In reference to box 50, the operator first checks to see if workstation 12 is on. If the workstation is on, the operator opens Window A. The operator then accesses VAX node HVIP with the GETSPEC utility to get a production planning schedule. The planning schedule would indicate which devices and lots need to be tested. The operator then selects the lot to be tested and finds out its work in progress (WIP) location on the test floor. The operator fetches the single recipe run card (used commonly for factory operation) in another Window E for displaying the run card. The run card information from HVIP node should indicate which hardware parts, such as printed circuit boards, are required for testing. The status of the required hardware part is then displayed in Window E. The operator then commands that the hardware part be obtained for the tester.

All these operations are performed in the HVIP mode where the HVIP node makes available as to what printed circuits are needed to the personal computer that controls the carousel through the Ethernet network. The personal computer enables an operator to obtain the hardware parts. As in existing network systems, HVIP node is set up to control and retrieve proper hardware parts from carousel 20. However, the operator need not be present physically at the personal computer at the carousel location or the HVIP node in order to control and obtain the proper hardware parts. All the operations can now be performed at the workstation at the tester location.

The operator then opens Window B for monitoring the testing of the tester. The hardware part retrieved is installed on the tester manually and the tester is logged in as shown in block 60. The communication between workstation 12 and tester 14 is conducted through monitor cable RS232 and data cable IEEE488. The operator then runs FTEST program for testing the device using the tester. Thus, the operator would input his or her name, identification of the tester, sorter/handler, and identification of the device and lot numbers. The workstation then links the tester to the HVIP node and downloads testing program files from HVIP to the tester controller (not separately shown for tester 14). The workstation performs checksum checking as a housekeeping rule and loads the testing program to the tester and runs the test program. The workstation checks the hardware and software, setup with correlation units and the software and hardware. The workstation specifies the data that should be collected for attribute checking and waits for the handler setup.

All the above-described steps are performed prior to actually running the tester to test the device selected. Since the sorter/handler is also to be setup before the tester is ready for testing, the operator then carries out the handler setup in accordance with block 70. In reference to block 70, the operator opens Window C, sets up the handler and connects the workstation to the handler. All this is performed through the RS232 cable connecting the sorter/handler 22 to the workstation 12. The operator checks for connection conditions and gets configuration information from HVIP or the CAM node. The operator then configures the handler either manually or automatically, and monitors the handler. It is possible for the operator to obtain a handler status report, collect data from the handler and analyze such data. The operator may also collect tester binning data from the tester and transfer data to the HVIP node.

The operator then opens Window D on the workstation monitor and runs the SYSDATA program to obtain a tester status report and gets the workstation ready for collecting and analyzing data, transferring data to the CAM node to update the processing control information at the node. The operator then continues to work in Window B. To verify the proper testing conditions of the sorter/handler and tester, a sample is first used, such as a mechanical dummy sample, although other samples for testing either electronic or mechanical properties may be used.

The sample is first brought to the mark and packing room for verification that the sample meets specifications. Then the sample is handled by the sorter/handler and its failure is indicated from the data collected from the handler/sorter.

The above verification procedure using a sample may be repeated periodically such as every two hours, or after a predetermined number of units has been tested to verify that the software and hardware setup are still proper.

The operator is then prepared to start testing for production. The operator first specifies what data should be collected from the tester and prints an electrical summary for the first predetermined number of parts, such as 200, and compares the result with the expected yield. If the yield is lower than expected, the operator would check the hardware and software setup to ensure that the setup is proper. If desired, all rejected parts may be rescreened and tested after a predetermined number of parts have been tested.

It will be noted that in the above operations, all of the operations indicated in the windows may be performed essentially simultaneously so that an operator need not wait until one operation is completed before proceeding to or continuing with another operation. Thus, after window D has been setup for the collecting of status and data information and for sending the information to the CAM node, the workstation automatically continues to collect and send data while the operator is performing the verification or the actual testing steps indicated in block 90. While both operations are being carried out, the operator may continue to obtain information or download files through window A from the HVIP node, or to retrieve run card information through window E, while at the same time monitoring the tester and sorter/handler through windows B and C.

The operator then performs quality assurance tests for 80/125 good parts and prints or displays the completed run card and revises and closes the data file. The data file is transferred to HVIP node and window B is closed.

In reference to block 100, the operator unloads the handler and returns the hardware to the carousel. Data including the yield of product, up-time of tester/handler and scheduled and unscheduled down-time are sent to the CAM node. The socket inventories are updated and all windows are closed. The operator then logs off the HVIP and the tester.

The invention has been described above by reference to specific embodiments. It will be understood, however, that various modifications and improvements may be made without departing from the scope of the invention which is to be limited only by the appended claims. For example, instead of requiring the operator to open a window as indicated above, the system software automatically opens the windows called for above, and the operator is asked to simply acknowledge and/or choose from certain software menus. All such and other variations are within the scope of the invention.

What is claimed is:

1. A system for controlling an integrated production process for the processing of semiconductor chips and packages, said process employing wafer sorters, package handlers, testers and a computer aided manufacturing node for providing and storing set up and wafer and package processing control information, said system comprising:
   a semiconductor chip, wafer, or a package; and
   a tester, sorter or a handler; and
   a control device dedicated to and connected to said tester, sorter or handler, for configuring and controlling the tester, sorter or handler; and wherein said device collects and analyzes data from the tester, sorter or handler; and
   a network connecting the device to the node, so that said device enables an operator to test, sort or handle said chip, wafer or package according to a predetermined routine, to obtain updated data concerning the chip, wafer or package from the tester, sorter or handler, and to update and send updated processing control information to the node.

2. The system of claim 1, wherein said device is connected to the tester and also connected to a sorter or handler, and is used to configure said sorter or handler and to control simultaneously the operation of the tester and the sorter or handler connected to such device.

3. The system of claim 2, wherein said device is connected to the sorter or handler by an electronic interface register cable, and wherein the tester and the sorter or handler connected to such device are not connected directly.

4. The system of claim 1, said system comprising a plurality of said devices and a plurality of said testers, sorters or handlers; wherein said network interconnects said devices and connects said devices to said node, so that each device enables an operator to test selected chips or packages according to a predetermined routine and to update and send updated processing control information to the node; and wherein at least two of said testers, sorters or handlers have different syntaxes and configurations.

5. The system of claim 4, wherein said devices have the same graphical user interface, so that the different syntaxes and configurations of the testers are transparent to an operator.

6. The system of claim 5, each device including means for storing processing control information from the node, so that when the network is not in operation, each device operates the tester, sorter or handler connected to it.

7. The system of claim 4, further comprising a host means connected to the network for storing processing control information from the node, for supplying the stored processing control information to each device and for carrying out computer aided manufacturing computations.

8. The system of claim 7, said integrated production process employing a carousel for storing hardware for use in testing wafers or packages, said stored processing control information including information on type of hardware that is to be used for testing a particular wafer or package, wherein each device obtains type of hardware information from the host means and to get the hardware from the carousel.

9. The system of claim 1, wherein said device is a workstation which performs simultaneously product testing and data analysis.

10. The system of claim 9, wherein said device is also connected to a tester, and sorter or handler, and configures said tester, and sorter or handler and controls simultaneously the operation of the tester and the sorter or handler connected to such device, wherein said workstation has a monitor and a graphical user interface that provides at least three windows on the monitor, said three windows including one each for configuring and controlling a tester, a sorter or handler and for data analysis.

11. A method for controlling an integrated production process for the processing of semiconductor chips and packages using wafer sorters, package handlers, testers and a computer aided manufacturing node for providing and storing set up and wafer and package processing control information; said method comprising the following steps using a tester, a sorter or a handler, and a control device and a network connecting said control device to said node:
- configuring the tester connected to the device;
- configuring the sorter or handler connected to the device;
- using the sorter to sort a wafer to be tested or a handler to handle a package to be tested;
- using the tester to test said wafer or package according to a predetermined routine; and
- collecting data related to said sorting or handling and said testing.

12. The method of claim 11, said method further comprising the step of retrieving the stored processing control information from a host means connected to the network and the step of supplying said information to the device.

13. The method of claim 11, further comprising updating the processing control information and sending to the node said updated processing control information.

14. The method of claim 11, said method further comprising the step of storing said processing control information prior to the using steps, so that said processing control information is available when said network is not in operation.

15. The method of claim 11, further comprising the step of analyzing the data collected in the collecting step.

16. The method of claim 11, further comprising verifying the setup of the tester, and the sorter or handler using a sample.

17. The method of claim 16, further comprising:
- analyzing the data collected in the collecting step;
- updating the processing control information and sending to the node said updated processing control information.

18. The method of claim 17, wherein said device is a workstation having a monitor and a graphical user interface that provides at least one window on the monitor, wherein said verifying, analyzing and updating steps each includes opening at least one window on the monitor.

19. The method of claim 17, wherein the verifying, analyzing, updating and sending steps are performed simultaneously.

20. The method of claim 11, said system including a carousel for storing hardware for use in testing wafers or packages, said method further including the steps of:
- obtaining type of hardware information from a host means using the carousel for identifying type of hardware that is to be used for testing a particular wafer or package; and
- getting the hardware from the carousel.

* * * * *